United States Patent
Trivedi et al.

(10) Patent No.: US 6,570,422 B1
(45) Date of Patent: *May 27, 2003

(54) PHASE LOCKED LOOP DESIGN WITH SWITCH FOR LOOP FILTER CAPACITANCE LEAKAGE CURRENT CONTROL

(75) Inventors: Pradeep Trivedi, Sunnyvale, CA (US); Sudhakar Bobba, Sunnyvale, CA (US); Claude R. Gauthier, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/199,421

(22) Filed: Jul. 19, 2002

(51) Int. Cl.[7] .................................................. H03L 7/06
(52) U.S. Cl. ....................................... 327/157; 327/148
(58) Field of Search ................................ 327/148, 147, 327/156, 157, 159, 150, 362; 331/15, 16, 17

(56) References Cited

U.S. PATENT DOCUMENTS

| | | | | |
|---|---|---|---|---|
| 5,374,904 A | * | 12/1994 | Ishibashi | 331/17 |
| 6,011,822 A | * | 1/2000 | Dreyer | 375/376 |
| 6,064,243 A | * | 5/2000 | Matsuda et al. | 327/156 |
| 6,218,892 B1 | * | 4/2001 | Soumyanath et al. | 327/537 |
| 6,473,485 B1 | * | 10/2002 | Fernandez-Texon | 377/27 |

OTHER PUBLICATIONS

John G. Maneatis, "Low–Jitter Process–Independent DLL and PLL Based on Self–Biased Techniques", IEEE Journal of Solid–State Circuits, vol. 31, No. 11, Nov. 1996, pp. 1723–1732.

* cited by examiner

*Primary Examiner*—Timothy P. Callahan
*Assistant Examiner*—Cassandra Cox
(74) *Attorney, Agent, or Firm*—Rosenthal & Osha L.L.P.

(57) ABSTRACT

A phase locked loop design that uses a switch operatively connected to a loop filter capacitor to control a leakage current of the loop filter capacitor is provided. By positioning a switch in series with the loop filter capacitor, the leakage current of the loop filter capacitor may be controlled by switching the switch 'on' when a charge pump of the phase locked loop is 'on' and switching the switch 'off' when the charge pump is 'off,' thereby cumulatively reducing the leakage current of the loop filter capacitor throughput the operation of the phase locked loop. Control and reduction of the loop filter capacitor leakage current leads to more reliable and stable phase locked loop behavior.

18 Claims, 5 Drawing Sheets

PHASE LOCKED LOOP DESIGN WITH SWITCH FOR LOOP FILTER CAPACITANCE LEAKAGE CURRENT CONTROL

BACKGROUND OF INVENTION

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as sys_clk) to various parts of the computer system 10. Modern microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

One component used within the computer system 10 to ensure a proper reference of time among a system clock and a microprocessor clock, i.e., "chip clock," is a type of clock generator known as a phase locked loop, or "PLL" 20. The PLL 20 is an electronic circuit that controls an oscillator such that the oscillator maintains a constant phase relative to a reference signal. Referring to FIG. 1, the PLL 20 has as its input the system clock, which is its reference signal, and outputs a chip clock signal (shown in FIG. 1 as chip_clk) to the microprocessor 12. The system clock and chip clock have a specific phase and frequency relationship that is controlled and maintained by the PLL 20. This relationship between the phases and frequencies of the system clock and chip clock ensures that the various components within the microprocessor 12 use a controlled and accounted for reference of time. When this relationship is not maintained by the PLL 20, however, the operations within the computer system 10 may become non-deterministic.

FIG. 2 shows a diagram of a typical PLL 30. The PLL 30 uses a phase frequency detector 36 that operatively receives an input clock signal, clk_in 32, and a feedback clock signal, fbk_clk 34. The phase frequency detector 36 compares the phases of the input clock signal 32 and the feedback clock signal 34, and dependent on the comparison, the phase frequency detector 36 outputs pulses on UP 38 and DOWN 40 signals to a charge pump 42. Depending on the pulses on the UP 38 and DOWN 40 signals, the charge pump 42 transfers charge to or from a loop filter capacitor 46 via a voltage control signal, Vctrl 45. Those skilled in the art will understand that the loop filter capacitor 46 along with a loop filter resistor 44 form a 'loop filter' of the PLL 30.

The voltage control signal 45 serves as an input to a bias generator 50, which, in turn, outputs at least one bias signal 51 to a voltage-controlled oscillator 52. The voltage-controlled oscillator (VCO) 52, dependent on the at least one bias signal 51, outputs a clock signal, clk_out 60, that (1) propagates through a clock distribution network 54 (modeled in FIG. 2 as buffers 56 and 58) and (2) serves as an output of the PLL 30. The output clock signal 60 is fed back through a feedback divider 62, which, in turn, outputs to a buffer 64 that generates the feedback clock signal 34 to the phase frequency detector 36. For a more detailed background on the operation and behavior of a PLL, see J. Maneatis, "Low-Jitter Process-Independent DLL and PLL Based on Self-Biased Techniques," IEEE Journal of Solid-State Circuits, vol. 31, no. 11, November 1996.

SUMMARY OF INVENTION

According to one aspect of the present invention, an integrated circuit comprises: a phase frequency detector arranged to detect a phase difference between a first clock signal and a second clock signal; a charge pump arranged to output a voltage control signal dependent on the phase difference; a capacitor operatively connected to the voltage control signal; a leakage control circuit operatively connected to the capacitor and a voltage potential, wherein the leakage control circuit comprises a switch responsive to the phase frequency detector; and a voltage-controlled oscillator arranged to output the second clock signal dependent on the voltage control signal.

According to another aspect, an integrated circuit comprises: means for detecting a phase frequency difference between a first clock signal and a second clock signal; means for generating a signal dependent on the phase frequency difference; means for storing charge to maintain a voltage potential on the signal; a switch arranged to control a leakage current of the means for storing charge dependent on the means for detecting the phase frequency difference; and means for generating the second clock signal dependent on the signal.

According to another aspect, a method for performing a phase locked loop operation comprises: comparing a phase difference between a first clock signal and a second clock signal; generating a voltage control signal dependent on the comparing; storing charge dependent on the voltage control signal using a capacitor; controlling a leakage current of the capacitor with a switch positioned in series with the capacitor, wherein the switch is responsive to the comparing; and generating the second clock signal dependent on the voltage control signal.

Other aspects and advantages of the invention will be apparent from the following description and the appended claims.

DETAILED DESCRIPTION

As device features, such as transistor features, used to implement integrated circuit components, e.g., PLLs, continue to get smaller, they may have higher leakage currents (i.e., higher gate tunneling currents). This is due to the fact that as transistor features are designed smaller, the thickness of the transistor's oxide layer (located between the transistor's gate and the semiconductor substrate) is reduced. As the oxide layer is reduced to a few angstroms, the transistor's gate terminal begins to leak charge to the other terminals of the transistor. In the case of a PLL's loop filter capacitor, which is typically desired to be large from a capacitance perspective and that can be implemented with a transistor, such reduction in transistor size features and consequential increase in leakage current can adversely affect the behavior of the PLL. In some cases, particular amounts of leakage current through the PLL's loop filter capacitor can even cause the PLL to malfunction. Accordingly, there is a need for a PLL design that guards against or compensates for a PLL loop filter capacitor's leakage current.

Figure 1:
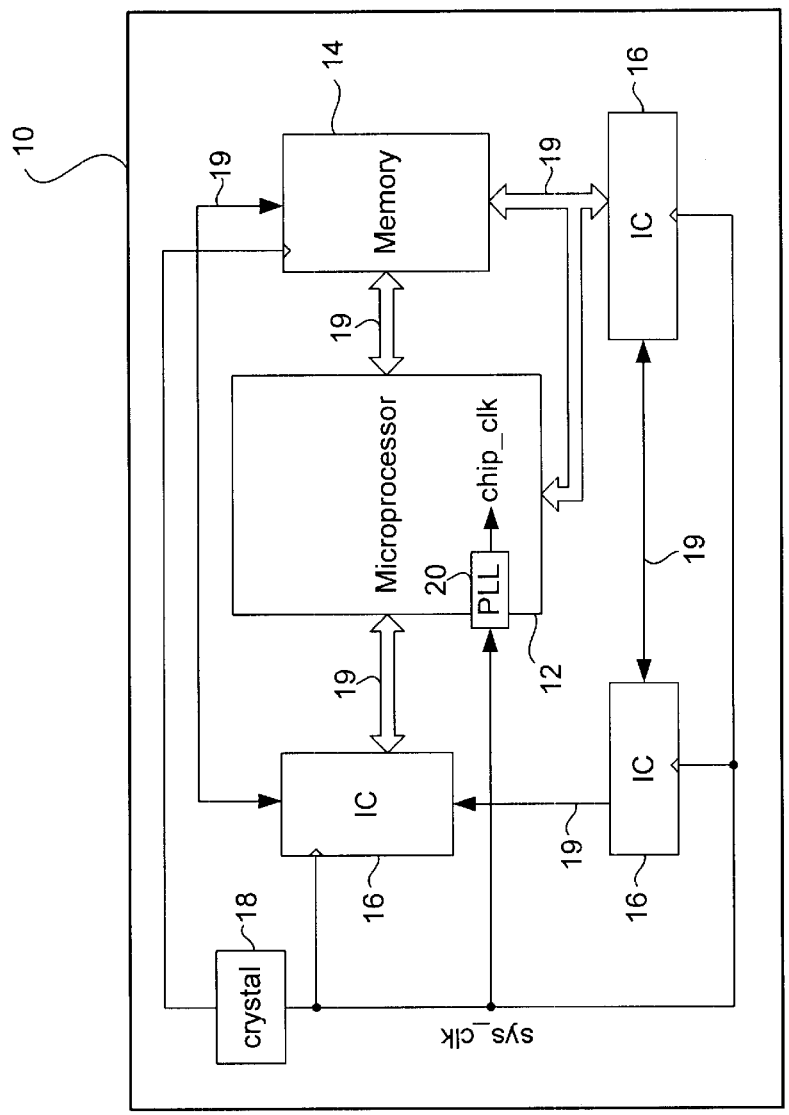
FIG. 1 shows a typical computer system.
Figure 2:
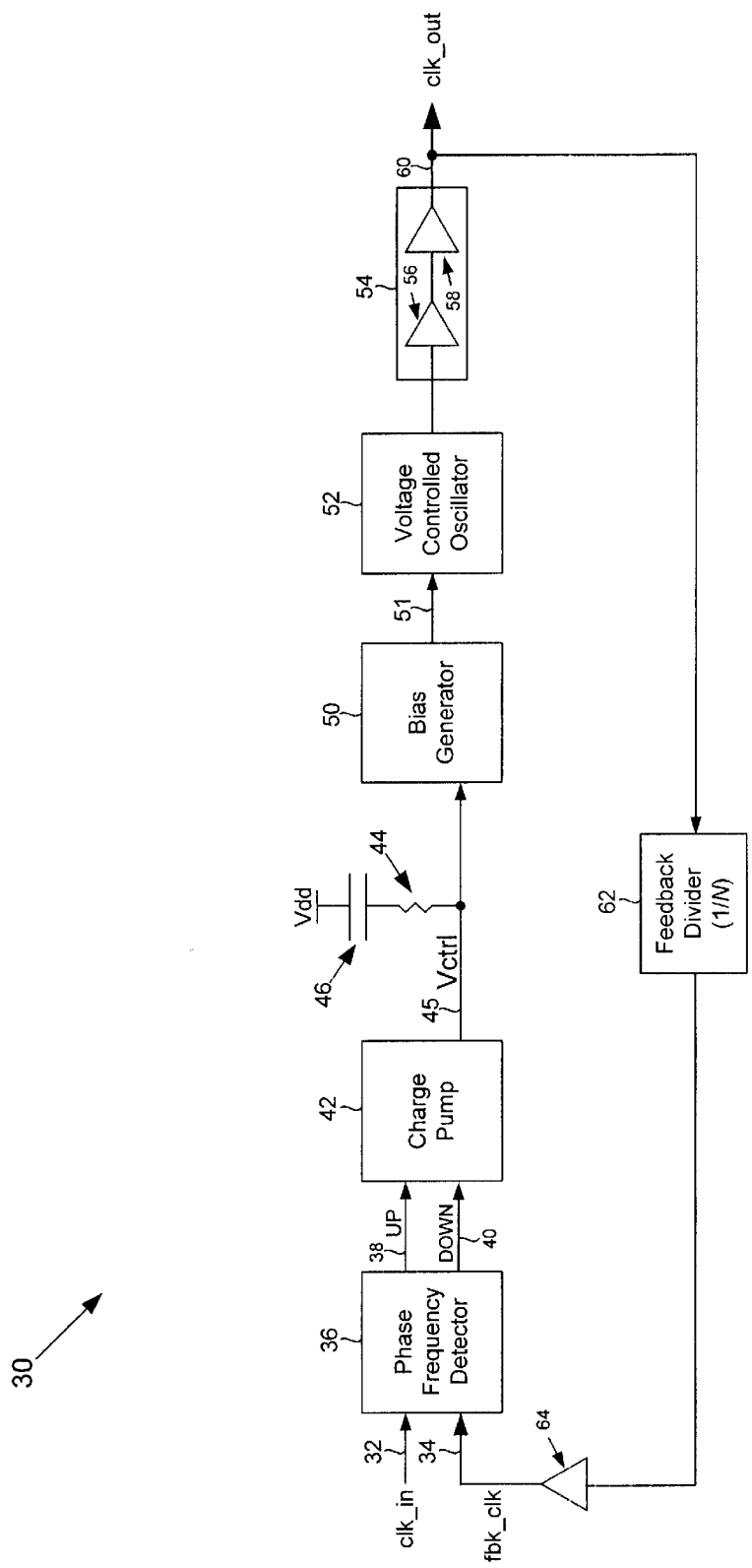
FIG. 2 shows a typical PLL.
Figure 3:
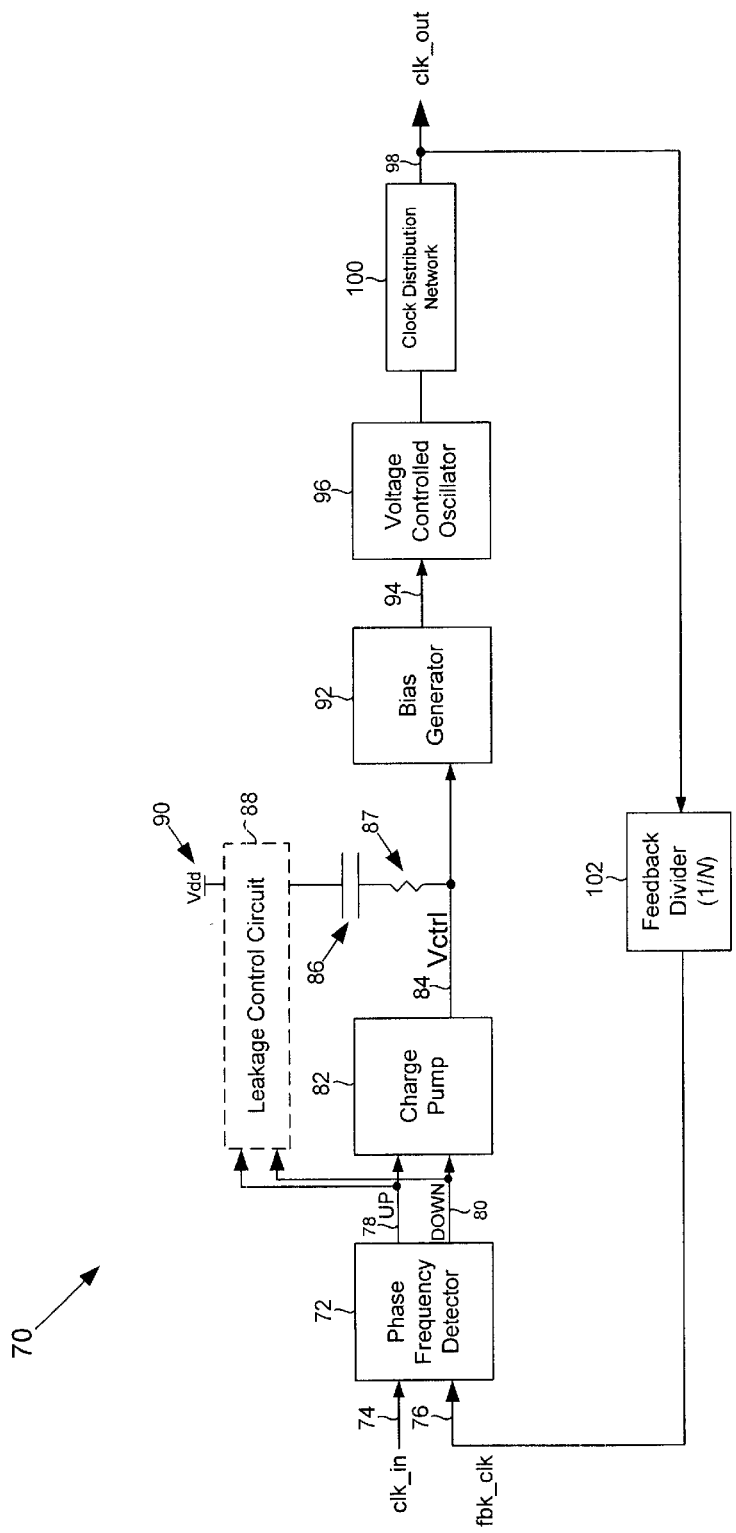
FIG. 3 shows a PLL in accordance with an embodiment of the present invention.

FIG. 3 shows a PLL 70 in accordance with an embodiment of the present invention. The PLL 70 uses a phase frequency detector 72 that detects a phase difference between an input clock signal, clk_in 74, and a feedback clock signal, fbk_clk 76. Dependent on the phase difference detected by the phase frequency detector 72, the phase frequency detector 72 outputs pulses on UP 78 and DOWN 80 signals to a charge pump 82. The charge pump 82, dependent on the pulses on the UP 78 and DOWN 80 signals, generates a voltage control signal, Vctrl 84.

Figure 5:
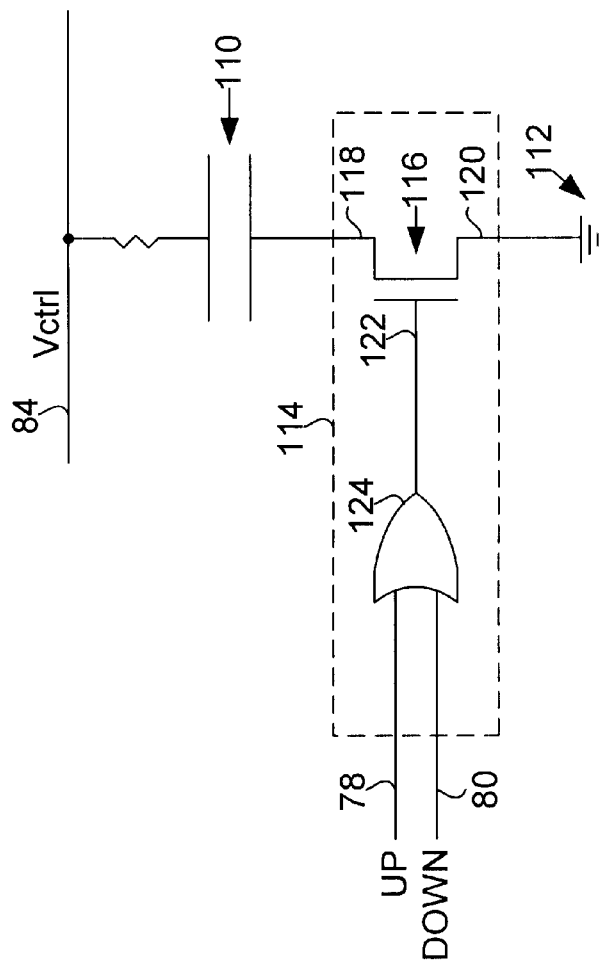
FIG. 5 shows a portion of a DLL in accordance with an embodiment of present invention.

For stability, the PLL 70 uses a loop filter, formed by a loop filter capacitor 86 and a loop filter resistor 87, that is operatively connected to the voltage control signal 84. The loop filter capacitor 86 stores/dissipates charge dependent on the voltage control signal 84. Those skilled in the art will understand that the loop filter capacitor 86 may be implemented using the gate capacitance of a metal-oxide semiconductor field-effect transistor (MOSFET). The UP 78 and DOWN 80 signals are pulsed only once per clock cycle, and therefore, the voltage control signal 84 may not be maintained due to the leakage current of the loop filter capacitor 86. To guard against increased leakage currents associated with smaller transistor features, a leakage control circuit 88 is positioned between the loop filter capacitor 86 and a voltage potential Vdd 90. Those skilled in the art will note, that in one or more other embodiments, the leakage control circuit 88 may be connected to a voltage potential Vss (as shown in FIG. 5) instead of the voltage potential Vdd 90.

As shown in FIG. 3, the leakage control circuit 88 is operatively connected to the UP 78 and DOWN 80 signals such that the leakage control circuit 88 (1) allows the loop filter capacitor 86 to leak when the charge pump 82 is 'on,' (the charge pump 82 is said to be 'on' when the charge pump 82 actively sources or sinks current to/from the voltage control signal 84) and (2) restricts the leakage current of the loop filter capacitor 86 when the charge pump 82 is 'off.' Those skilled in the art will understand that whenever one or both of the UP 78 and DOWN 80 signals is pulsed, the charge pump 82 turns 'on' for the duration of the pulse(s). A more detailed description of a leakage control circuit is given below with reference to FIGS. 4 and 5.

Referring to FIG. 3, the voltage control signal 84 serves as an input to a bias generator 92 that produces at least one bias signal 94 to a voltage-controlled oscillator (VCO) 96. The voltage-controlled oscillator 96, dependent on the at least one bias signal 94 from the bias generator 92, generates an output clock signal, clk_out 98. The output clock signal 98, in addition to serving as an output of the PLL 70, is fed back to an input of the phase frequency detector 72 through a clock distribution network 100 and a feedback divider 102. Those skilled in the art will note that, in one or more other embodiments, the PLL 70 may be implemented without the bias generator 92 by operatively connecting the voltage-controlled oscillator 96 with the voltage control signal 84.

Figure 4:
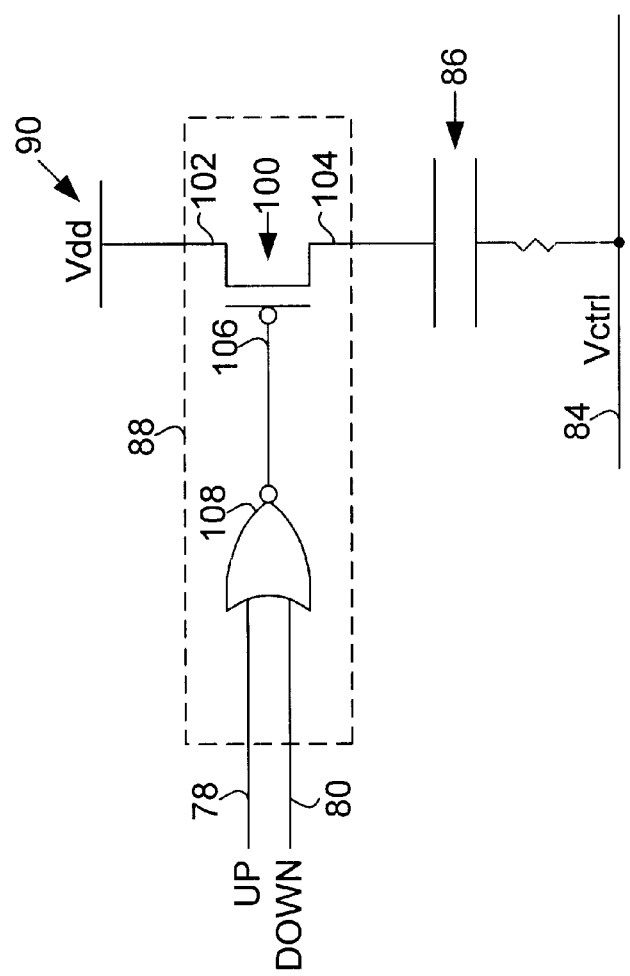
FIG. 4 shows a portion of the PLL shown in FIG. 3 in accordance with embodiment of the present invention.

FIG. 4 shows an implementation of the leakage control circuit 88 shown in FIG. 3 in accordance with an embodiment of the present invention. In FIG. 4, the leakage control circuit 88 includes a p-channel transistor switch 100 and NOR gate circuitry 108 responsive to the UP 78 and DOWN 80 signals (from the phase frequency detector 72 as shown in FIG. 3). More particularly, the p-channel transistor switch 100 has a first terminal 102 operatively connected to the voltage potential Vdd 90 and a second terminal 104 operatively connected to the loop filter capacitor 86. A gate terminal 106 of the p-channel transistor switch 100 is operatively connected to an output of the NOR gate circuitry 108. The NOR gate circuitry 108 outputs 'low' when one or both of the UP 78 and DOWN 80 signals are 'high' and outputs 'high' when both the UP 78 and DOWN 80 signals are 'low.' Accordingly, when one or both of the UP 78 and DOWN 80 signals are 'high,' (i.e., the charge pump (82 in FIG. 3) is 'on'), the NOR gate circuitry 108 outputs 'low' to the p-channel transistor switch 100, which, in turn, causes the p-channel transistor switch 100 to switch 'on' and allow the loop filter capacitor 86 to leak. Conversely, when both the UP 78 and DOWN 80 signals are 'low' (i.e., the charge pump (82 in FIG. 3) is 'off'), the NOR gate circuitry 108 outputs 'high' to the p-channel transistor switch 100, which, in turn, causes the p-channel transistor switch 100 to switch 'off' and restrict the leakage current of the loop filter capacitor 86.

Due to this configuration, the leakage current of the loop filter capacitor 86 is controlled because it cannot get larger than the source to drain current of the p-channel transistor switch 100. Moreover, because the charge pump (82 in FIG. 3) is 'off' the majority of the time, the cumulative reduction of the loop filter capacitor's 86 leakage current facilitates the increased integrity of the voltage control signal 84, which, in turn, leads to reliable and stable PLL operation.

FIG. 5 shows a leakage control circuit 114 in accordance with another embodiment of the present invention. In FIG. 5, a PLL loop filter capacitor 110 is referenced to a voltage potential Vss, or ground 112, instead of the voltage potential Vdd (90 in FIGS. 3 and 4). In this embodiment, the leakage control circuit 114 includes a n-channel transistor switch 116 an OR gate circuitry 124 responsive to the UP 78 and DOWN 80 signals (from the phase frequency detector 72 as shown in FIG. 3). More particularly, the n-channel transistor switch 116 has a first terminal 120 operatively connected to the voltage potential ground 112 and a second terminal 118 operatively connected to the loop filter capacitor 110. A gate terminal 122 of the n-channel transistor switch 116 is operatively connected to an output of the OR gate circuitry 124. The OR gate circuitry 124 outputs 'high' when one or both of the UP 78 and DOWN 80 signals are 'high' and outputs 'low' when both the UP 78 and DOWN 80 signals are 'low.' Accordingly, when one or both of the UP 78 and DOWN 80 signals are 'high,' (i.e., the charge pump (82 in FIG. 3) is 'on'), the OR gate circuitry 124 outputs 'high' to the n-channel transistor switch 116, which, in turn, causes the n-channel transistor switch 116 to switch 'on' and allow the loop filter capacitor 110 to leak. Conversely, when both the UP 78 and DOWN 80 signals are 'low' (i.e., the charge pump (82 in FIG. 3) is 'off'), the OR gate circuitry 124 outputs 'low' to the n-channel transistor switch 116, which, in turn, causes the n-channel transistor switch 116 to switch 'off' and restrict the leakage current of the loop filter capacitor 110.

Due to this configuration, the leakage current of the loop filter capacitor 110 is controlled because it cannot get larger than the source to drain current of the n-channel transistor switch 116. Moreover, because the charge pump (82 in FIG. 3) is 'off' the majority of the time, the cumulative reduction of the loop filter capacitor's 110 leakage current facilitates the increased integrity of the voltage control signal 84, which, in turn, leads to reliable and stable PLL operation.

Those skilled in the art will understand that, in other embodiments, the switches in the leakage control circuit (88 in FIG. 4 and 114 in FIG. 5) may be implemented using devices other than p- and n-channel transistors.

Advantages of the present invention may include one or more of the following. In one or more embodiments, because a leakage current of a PLL loop filter capacitor may be controlled, a more stable and reliable operation of the PLL may be facilitated. Accordingly, the phase shift of the PLL may not drift or may not drift as much as a PLL design that does not use a switch to resistively isolate the loop filter capacitor.

In one or more embodiments, because a switch positioned in series with a PLL loop filter capacitor helps control a leakage current of the PLL loop filter capacitor, the chip area consumed by the PLL loop filter capacitor may be reduced because the PLL loop filter capacitor does not have to be as large to maintain the voltage potential on a voltage control signal.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a phase frequency detector arranged to detect a phase difference between a first clock signal and a second clock signal;
   a charge pump arranged to output a voltage control signal dependent on the phase difference;
   a capacitor operatively connected to the voltage control signal;
   a leakage control circuit operatively connected to the capacitor and a voltage potential, wherein the leakage control circuit comprises a switch responsive to the phase frequency detector; and
   a voltage-controlled oscillator arranged to output the second clock signal dependent on the voltage control signal.

2. The integrated circuit of claim 1, wherein the voltage potential is ground.

3. The integrated circuit of claim 1, wherein the switch is positioned in series with the capacitor.

4. The integrated circuit of claim 1, wherein the capacitor is a loop filter capacitor.

5. The integrated circuit of claim 1, wherein the capacitor is implemented with a transistor.

6. The integrated circuit of claim 1, wherein the switch is implemented with a transistor.

7. The integrated circuit of claim 6, the leakage control circuit further comprising:
   circuitry with an output operatively connected to a gate terminal of the transistor.

8. The integrated circuit of claim 1, further comprising:
   a bias generator arranged to output at least one bias signal dependent on the voltage control signal.

9. An integrated circuit, comprising:
   means for detecting a phase frequency difference between a first clock signal and a second clock signal;
   means for generating a signal dependent on the phase frequency difference;
   means for storing charge to maintain a voltage potential on the signal;
   a switch arranged to control a leakage current of the means for storing charge dependent on the means for detecting the phase frequency difference; and
   means for generating the second clock signal dependent on the signal.

10. The integrated circuit of claim 9, further comprising means for controlling the switch.

11. The integrated circuit of claim 9, wherein the switch is positioned in series with the means for storing charge.

12. The integrated circuit of claim 9, wherein the switch is implemented with a transistor.

13. A method for performing a phase locked loop operation, comprising:
   comparing a phase difference between a first clock signal and a second clock signal;
   generating a voltage control signal dependent on the comparing;
   storing charge dependent on the voltage control signal using a capacitor;
   controlling a leakage current of the capacitor with a switch positioned in series with the capacitor, wherein the switch is responsive to the comparing; and
   generating the second clock signal dependent on the voltage control signal.

14. The method of claim 13, wherein the switch and the capacitor are positioned between a voltage potential and the voltage control signal.

15. The method of claim 14, wherein the voltage potential is ground.

16. The method of claim 13, wherein the capacitor is a loop filter capacitor.

17. The method of claim 13, wherein the capacitor is implemented with a transistor.

18. The method of claim 13, wherein the switch is implemented with a transistor.

* * * * *